(12) United States Patent
Caretti et al.

(10) Patent No.: US 10,439,763 B2
(45) Date of Patent: Oct. 8, 2019

(54) NETWORK INFORMATION TRANSMISSION IN A MOBILE COMMUNICATION NETWORK

(71) Applicant: Telecom Italia S.p.A., Milan (IT)

(72) Inventors: Marco Caretti, Turin (IT); Gian Michele Dell'aera, Turin (IT); Maurizio Fodrini, Turin (IT); Bruno Melis, Turin (IT)

(73) Assignee: Telecom Italia S.p.A., Milan (IT)

( * ) Notice: Subject to any disclaimer, the term of this patent is extended or adjusted under 35 U.S.C. 154(b) by 0 days.

(21) Appl. No.: 15/740,485

(22) PCT Filed: Jun. 30, 2015

(86) PCT No.: PCT/EP2015/064893
§ 371 (c)(1),
(2) Date: Dec. 28, 2017

(87) PCT Pub. No.: WO2017/000999
PCT Pub. Date: Jan. 5, 2017

(65) Prior Publication Data
US 2018/0198562 A1   Jul. 12, 2018

(51) Int. Cl.
*H04L 1/00* (2006.01)
*H04W 72/12* (2009.01)
(Continued)

(52) U.S. Cl.
CPC ............ *H04L 1/0077* (2013.01); *H04L 1/009* (2013.01); *H04L 5/005* (2013.01); *H04W 72/121* (2013.01);
(Continued)

(58) Field of Classification Search
None
See application file for complete search history.

(56) References Cited

U.S. PATENT DOCUMENTS 7,420,992 B1 * 9/2008 Fang ............... H04L 12/4633
                                                          370/477
2006/0245505 A1 * 11/2006 Limberg ........... H03M 13/2906
                                                          375/240.27
(Continued)

FOREIGN PATENT DOCUMENTS

WO   2008/024214 A2   2/2008
WO   2014/113173 A1   7/2014

OTHER PUBLICATIONS

D. S. Lun, M. Médard, R. Koetter, "Network Coding for Efficient Wireless Unicast", Proceedings of the 2006 International Zurich Seminar on Communications, p. 74-77, Feb. 21-24 2006.
(Continued)

*Primary Examiner* — Michael J Moore, Jr.
(74) *Attorney, Agent, or Firm* — Banner & Witcoff, Ltd.

(57) ABSTRACT

A method for transmitting broadcast network information in a mobile wireless communication network includes a plurality of network nodes. The method includes providing a compression of broadcast network information related to a group of coordinated network nodes of the plurality of network nodes; coding the compressed broadcast network information by segmenting the compressed broadcast network information into a number of blocks and linearly combining the blocks into a plurality of linear combinations of blocks; and transmitting the linear combinations of blocks by the group of coordinated network nodes.

15 Claims, 5 Drawing Sheets

(51) Int. Cl.
*H04L 5/00* (2006.01)
*H03M 13/29* (2006.01)

(52) U.S. Cl.
CPC . *H03M 13/2957* (2013.01); *H04L 2001/0093* (2013.01)

(56) References Cited

U.S. PATENT DOCUMENTS

| | | | |
|---|---|---|---|
| 2010/0075706 A1* | 3/2010 | Montojo | H04W 72/1273 455/513 |
| 2012/0163223 A1* | 6/2012 | Lo | H04L 5/0007 370/252 |
| 2012/0207079 A1* | 8/2012 | Wang | H04W 28/0284 370/315 |
| 2014/0204851 A1 | 7/2014 | Chen et al. | |
| 2016/0127737 A1* | 5/2016 | Bertolotti | H04N 19/00 375/240.01 |
| 2016/0277197 A1* | 9/2016 | Jose | H04W 64/00 |
| 2016/0286559 A1* | 9/2016 | Abedini | H04W 52/58 |

OTHER PUBLICATIONS

I-Hong Hou et al., "Real-time communication over unreliable wireless links: a theory and its applications", IEEE Wireless Communications, vol. 19, No. 1, Feb. 1, 2012, pp. 48-59, XP011442640.
Mar. 15, 2016—(WO) Written Opinion of the ISA and ISR—App PCT/EP2015/064893.

* cited by examiner

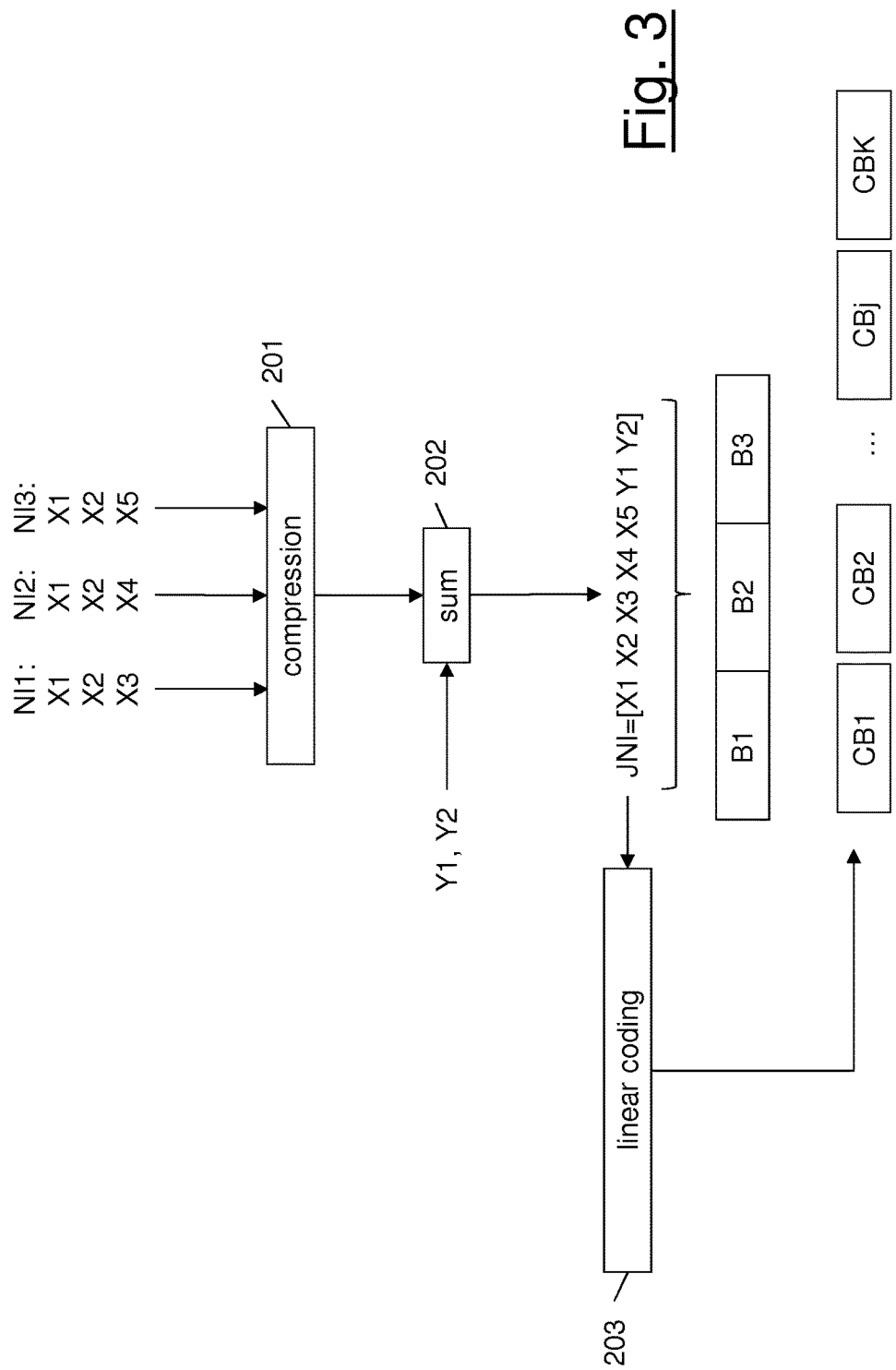

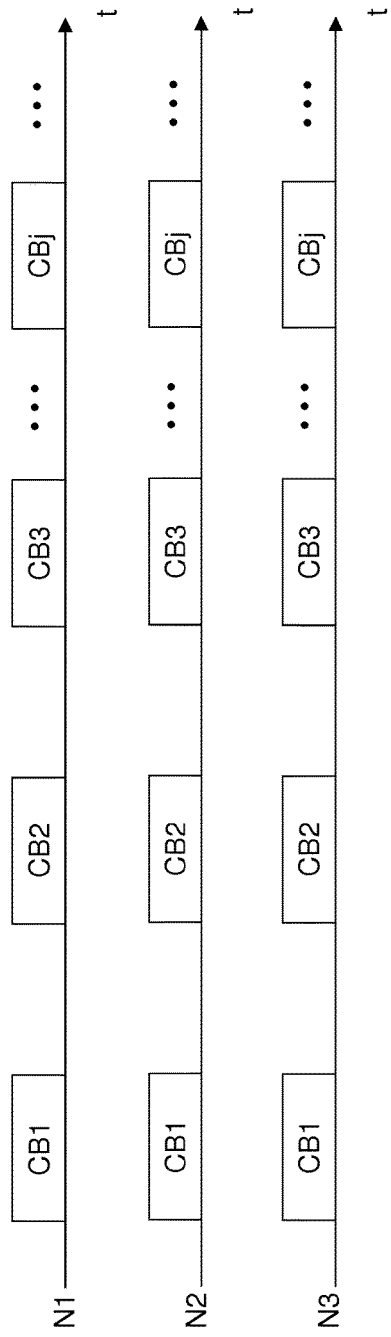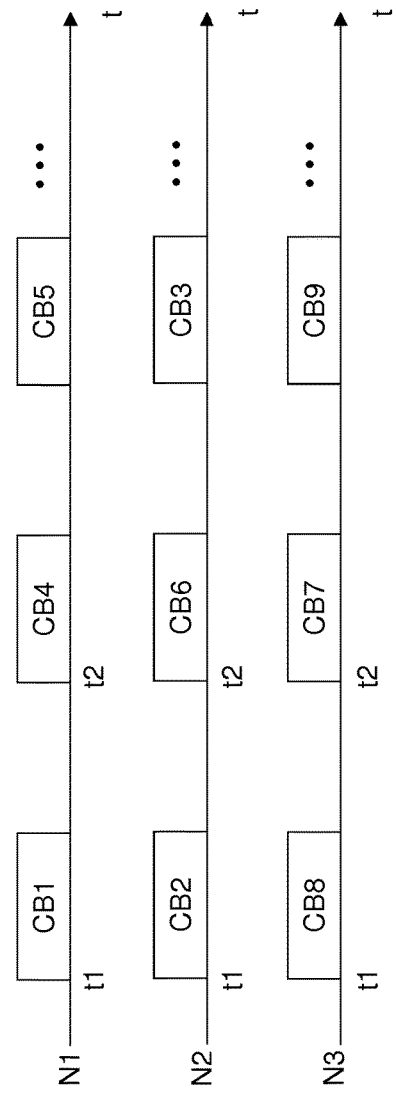

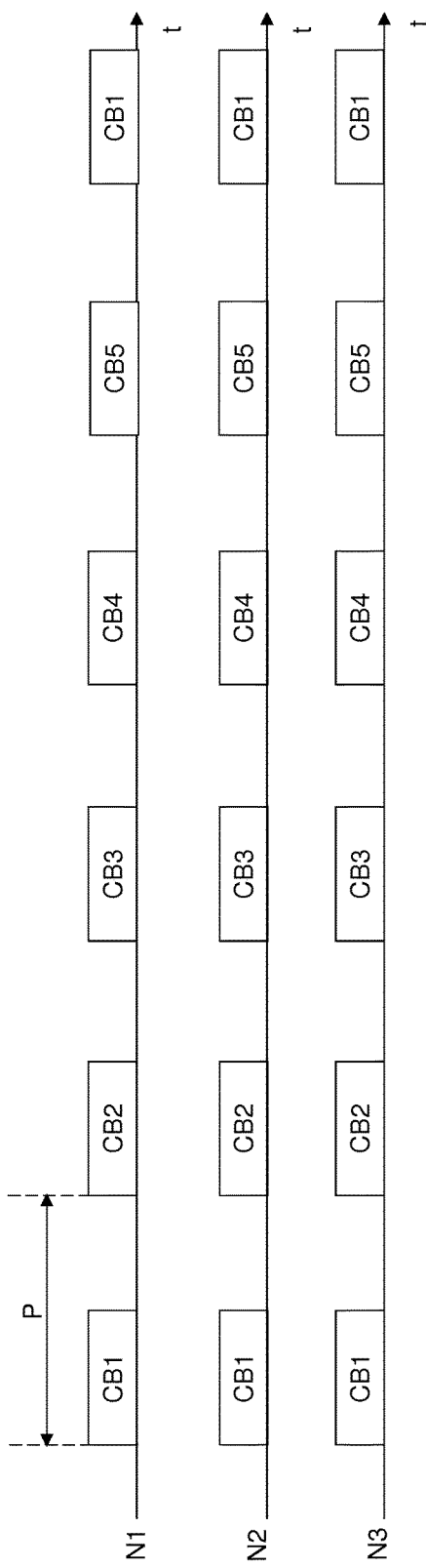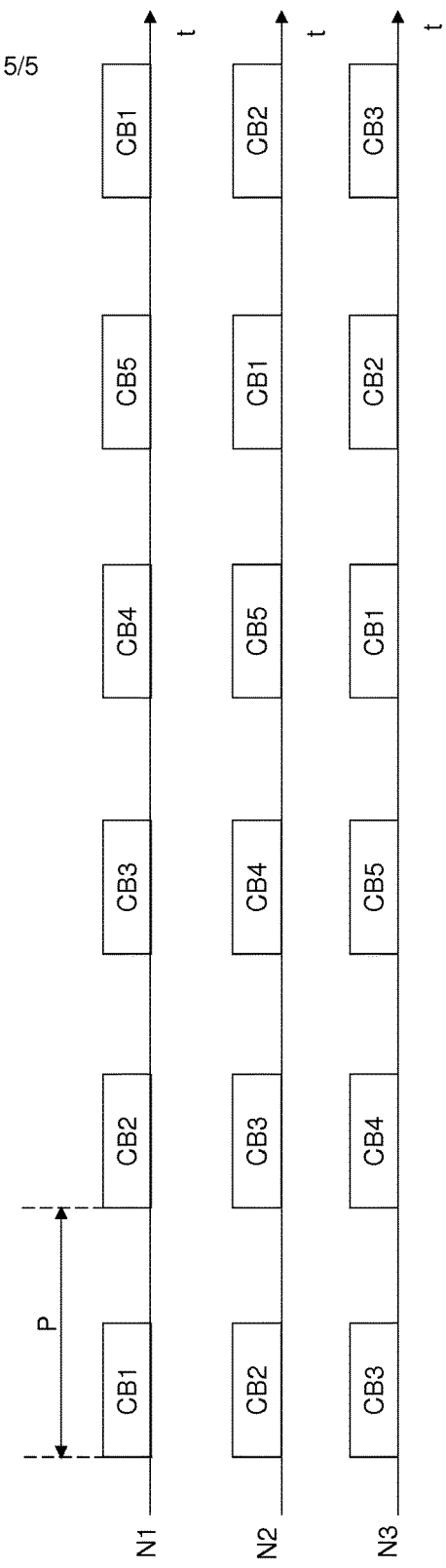

NETWORK INFORMATION TRANSMISSION IN A MOBILE COMMUNICATION NETWORK

TECHNICAL FIELD

The present invention relates to the field of mobile communication networks. In particular, the present invention relates to a method for transmitting broadcast network information in a mobile communication network, such as, for example, an LTE (Long Term Evolution) network.

BACKGROUND ART

As known, a mobile communication network, such as an LTE (Long Term Evolution) communication network, comprises a radio access network (also termed E-UTRAN, namely Evolved UMTS Terrestrial Radio Access Network) comprising a plurality of network nodes (also termed eNodeB) spread over a certain geographical area. Each network node typically provides radio coverage in one or more cells, each cell being an area nearby the network node. The network node in particular exchanges data with user terminals (namely, mobile phones, smartphones, tablets, etc.) located within its cell(s). Data are typically exchanged within time slots of a radio frame carried over a number of frequency sub-carriers of the network frequency bands.

Typically, each network node transmits a synchronization channel with synchronization signals, which are exploited by the user of the network to discover the cell identifier (also termed CID) that identifies the network node. In an LTE communication network, two synchronization signals are typically used, namely the Primary Synchronization Signal, PSS, and the Secondary Synchronization Signal, SSS. As known, at the user terminal, the CID is needed to obtain a time/frequency resource for transmission within the cell and to recover the cell specific reference signals (RS).

In an LTE communication network, the time/frequency resources are organized in a OFDM (Orthogonal Frequency Division Multiplexing) time/frequency grid, wherein a number of frequency sub-carriers are assigned to radio sub-frames of 1 ms in length comprised within a radio frame having a length of 10 ms. Each subframe comprises two time slots, each time slot consisting of a number of OFDM symbols. The cell specific reference signals are reference (or pilot) symbols inserted within the OFDM time/frequency grid at predefined time/frequency locations. The cell specific reference signals are typically used to decode both the Physical Broadcast Channel (PBCH) and other downlink physical channels, such as the Physical Downlink Control Channel (PDCCH) and the Physical Downlink Shared Channel (PDSCH) transmitted by each single node. The PBCH broadcasts the Master Information Block (MIB) that contains network information needed by the user terminal(s) to access the communication network and to acquire other information from the network node. The MIB has a size equal to 14 information bits plus 10 spare bits, which are transmitted with a period of 40 ms. As known, the MIB carries the following information fields: downlink system bandwidth, Physical H-ARQ Information Channel (PHICH) structure and System Frame Number.

Though the description above makes reference to an exemplary LTE communication network, the concept of broadcasting network information necessary for accessing the network is common to any currently available mobile communication system. For instance, as known, in a 3G UMTS communication network, each Node B broadcasts system information including a Master Information Block containing the network information needed by the user terminal(s) to access the communication network, such as scheduling information, a PLMN (Public Land Mobile Network) identifier, a PLMN type, and so on.

WO 2014/113173 discloses techniques and apparatus for enhanced physical broadcast channel (PBCH) for new carrier type (NCT) in long term evolution (LTE). According to certain aspects, a method for wireless communications by a base station (BS) is provided. The method generally includes generating an enhanced physical broadcast channel (EPBCH) using a frequency division multiplexed (FDM) structure, wherein the EPBCH spans substantially a sub-frame duration and transmitting the EPBCH.

SUMMARY OF THE INVENTION

According to the above, in current mobile communication networks, a number of essential broadcast network information are transmitted by each node of the network using a broadcast channel.

The inventors noticed that when a user terminal receives the broadcast network information carried over the broadcast channel, it does not send any feedback to the node which may allow verifying whether the user terminal correctly acquired the broadcast network information. Therefore, typically, the transmission of the broadcast channel is performed by using a large amount of redundancy in order to guarantee reliable reception of the broadcast network information at the user terminal.

Moreover, the inventors noticed that nowadays the increasing demand of channel quality pushes towards the introduction of new features aiming the user terminal to be assisted by the communication network in order to remove inter-cell interference. Currently, in order to implement such features, a user terminal that has accessed the communication network should acquire from its serving node further information about interfering nodes. Furthermore new generation networks, because of their flexibility in band utilization, need more network information to be broadcast. These procedures may introduce some undesired latency.

On the other hand, broadcasting further information (e.g. information about interfering nodes) over the broadcast channel would lead to increase the network information that a node is sending over the broadcast channel and hence would lead to reduce the redundancy which is typically used to protect the broadcast network information itself. It follows that in such a situation the reception reliability of the broadcast network information would be disadvantageously reduced.

In view of the above, the Applicant has tackled the problem of providing a method for transmitting broadcast network information in a mobile communication network which overcomes the aforesaid drawbacks.

In particular, the Applicant has tackled the problem of providing a method for transmitting broadcast network information in a mobile communication network which allows a network node to broadcast an increased amount of network information (comprising, for instance, information related to other network nodes) to the user terminal(s) served by the node without reducing the reception reliability of the network information.

In the present description and in the claims, the expression "time/frequency resource" will indicate a combination of network resources in both time and frequency domains. The time/frequency resource comprises a number of frequency sub-carriers allocated for transmission of a predefined amount of data within the communication network and, in combination, a predefined amount of time within the radio frame during which such transmission may take place. For instance, in an LTE communication network, a time/frequency resource allocated for transmission of the primary synchronization signal PSS comprises 62 sub-carriers and the last OFDM symbol of the first and 11-th time slots of each LTE radio frame.

Moreover, the expression "broadcast network information" indicates information transmitted by a network node of the communication network and needed by any user terminal to access the communication network and/or to acquire other information from the network node. Examples of broadcast network information are the information contained in the Master Information Block (MIB) in an LTE communication network. Moreover, according to the present invention, the "broadcast network information" transmitted by a network node comprise also information related to one or more other network nodes of the communication network such as, for instance, identifiers of these other network nodes, transmit powers, frame and subframe configurations, indicators of network node's statuses or conditions (e.g. load indicators). These latter information may allow, for instance, to implementation of inter-cell interference coordination and cancellation techniques at the user terminal receiver.

According to a first aspect, the present invention provides a method for transmitting broadcast network information in a mobile wireless communication network comprising a plurality of network nodes, the method comprising:
a) providing a compression of broadcast network information related to a group of coordinated network nodes of the plurality of network nodes;
b) coding the compressed broadcast network information by segmenting the compressed broadcast network information into a number of blocks and linearly combining the blocks into a plurality of linear combinations of blocks; and
c) transmitting the linear combinations of blocks by the group of coordinated network nodes.

Preferably, the method further comprises associating the group of coordinated network nodes with a group identifier and each coordinated network node with a joint cell identifier comprising the group identifier and a specific cell identifier.

Preferably, providing a compression of broadcast network information comprises eliminating redundancies in the broadcast network information of the group of coordinated network nodes.

Preferably, providing a compression of broadcast network information comprises implementing a lossless compression algorithm.

Preferably, the method further comprises, after the coding, applying an inner channel coder selected between a Viterbi coder and a Turbo coder.

Preferably, the method further comprises modulating for transmission the linear combinations, wherein modulating comprises applying a QPSK modulation.

Preferably, the method further comprises transmitting, by each coordinated network node, al least one synchronization signal allowing to recover, at a user terminal, the respective joint cell identifier.

According to an embodiment of the present invention, transmitting the linear combinations of blocks comprises cyclically transmitting a same sequence of the linear combinations by each coordinated network node in a synchronized manner over a joint physical broadcasting channel.

According to this embodiment, the method further comprises generating, at the coordinated network nodes, on the basis of the group identifier, one or more joint reference signals, the joint reference signals being the same for all the coordinated network nodes, and wherein the method further comprises using, at the user terminal, the joint cell identifier to recover the joint reference signals and decode the joint physical broadcasting channel.

According to another embodiment of the present invention, transmitting the linear combinations of blocks comprises cyclically transmitting a different sequence of the linear combinations by each coordinated network node over a joint physical broadcasting channel.

According to this embodiment, the method further comprises generating, at each coordinated network nodes, on the basis of the specific cell identifier, one or more reference signals, the reference signals being different among the coordinated network nodes, and wherein the method further comprises using, at the user terminal, the joint cell identifier to recover the joint reference signals and decode the joint physical broadcasting channel.

According to a second aspect, the present invention provides a controller for a mobile wireless communication network comprising a plurality of network nodes, the controller being configured to:
provide a compression of broadcast network information related to a group of coordinated network nodes of the plurality of network nodes; and
code the compressed broadcast network information by segmenting the compressed broadcast network information into a number of blocks and linearly combining the blocks into a plurality of linear combinations of blocks.

According to a third aspect, the present invention provides a mobile wireless communication network comprising a plurality of network nodes and a controller, the controller being configured to:
provide a compression of broadcast network information related to a group of coordinated network nodes of the plurality of network nodes;
code the compressed broadcast network information by segmenting the compressed broadcast network information into a number of blocks and linearly combining the blocks into a plurality of linear combinations of blocks;
and the group of coordinated network nodes being configured to transmit the linear combinations of blocks.

According to an embodiment of the present invention, the coordinated network nodes implement a single frequency network, SFN.

Preferably, the communication network is a long term evolution, LTE, communication network.

BRIEF DESCRIPTION OF THE DRAWINGS

The present invention will become clearer from the following detailed description, given by way of example and not of limitation, to be read with reference to the accompanying drawings, wherein:
FIG. 3 illustrates in more detail some steps of the flow chart of FIG. 2;

FIGS. 4*a* and 4*b* schematically illustrate the transmission of broadcast network information according to, respectively, a first embodiment and a second embodiment of the method of the present invention; and FIGS. 5*a* and 5*b* schematically illustrate a further example of transmission of broadcast network information according to, respectively, the first embodiment and the second embodiment of the method of the present invention.

DETAILED DESCRIPTION OF PREFERRED EMBODIMENTS OF THE INVENTION

Figure 1:
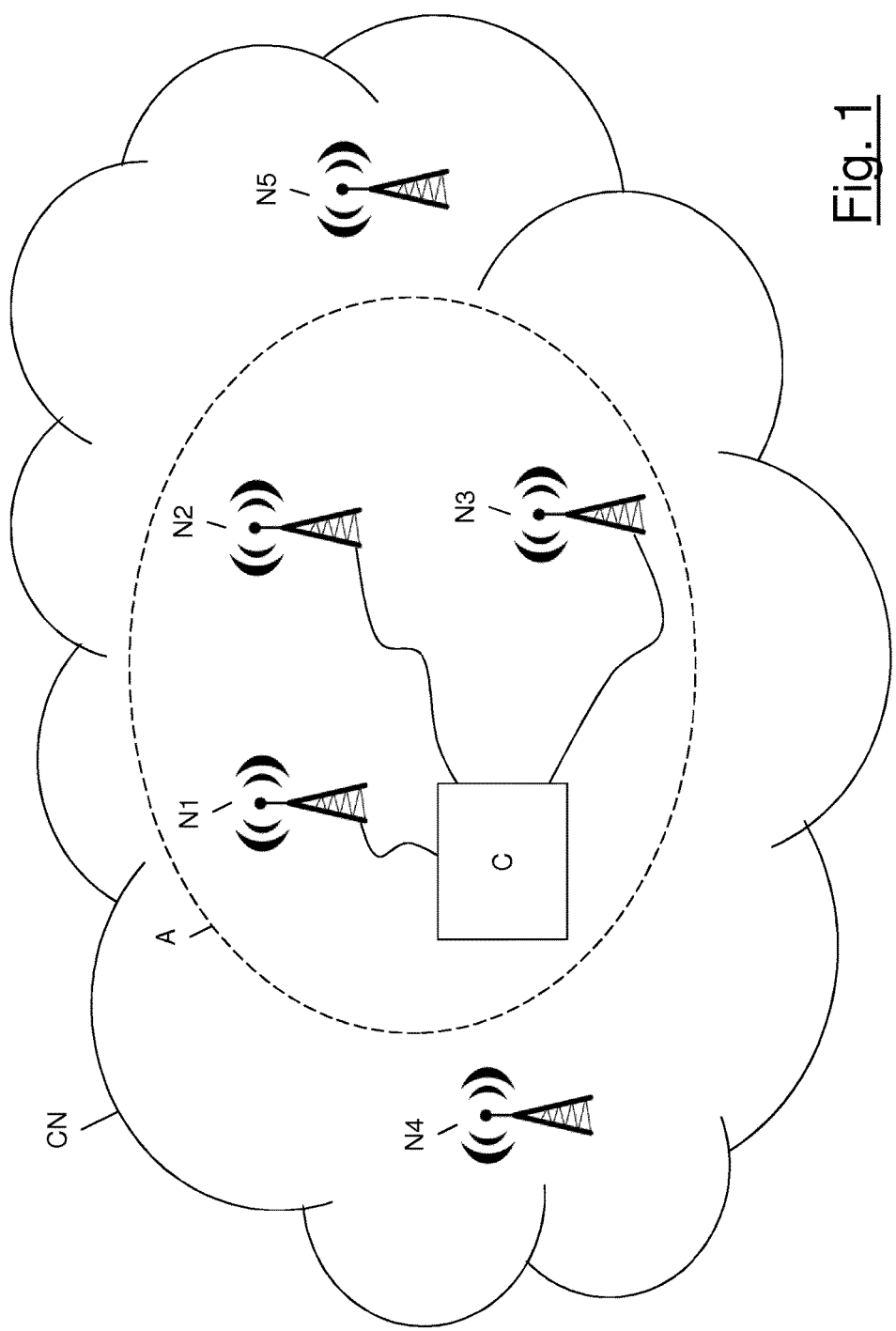
FIG. 1 schematically shows a communication network according to the present invention.

FIG. 1 shows a mobile communication network CN (which will be referred to in the following description simply as "communication network CN") according to an embodiment of the present invention. Preferably, the communication network CN is distributed over a plurality of cells and comprises one or more network nodes providing a radio coverage for the users of the communication network. The communication network CN shown in FIG. 1 comprises, for sake of example, five network nodes N1, N2, N3, N4 and N5.

The network nodes N1-N5 of the communication network CN are preferably configured to exchange data with user terminal(s) (such as, for instance, mobile phones, smartphones, tablets and the like) according to multiple access techniques for the downlink and uplink transmissions.

The communication network CN may be, for instance, the radio access network (namely, an E-UTRAN) of a Long Term Evolution (LTE) communication network or a LTE-Advanced communication network and it may be based on the OFDMA (Orthogonal Frequency Division Multiple Access) technique for downlink transmission and on the SC-FDMA (Single Carrier-Frequency Division Multiple Access) technique for the uplink transmission. In this case, each network node N1-N5 is an eNodeB.

Each network node N1-N5 of the communication network CN is preferably configured to transmit and receive data to/from a user terminal according to a scheduling of time and frequency resources. Time resources correspond to time slots of a radio frame while frequency resources correspond to sub-bands (or sub-carriers) of the frequency band allocated for the data transmission. For instance, in an LTE communication network, the time/frequency resources are organized in a OFDM (Orthogonal Frequency Division Multiplexing) time/frequency grid, wherein a number of frequency sub-carriers are assigned to radio subframes of 1 ms in length comprised within a radio frame having a length of 10 ms. Each subframe comprises two time slots, each time slot consisting of a number of OFDM symbols. Scheduling of data transmission is performed on a symbol or time slot or subframe basis.

Moreover, each network node N1-N5 of the communication network CN is preferably configured to broadcast a number of channels comprising network information needed by the user terminals to access the communication network CN and/or to acquire other information from the network node. As it will be described in greater detail herein after, the information broadcast by a network node N1-N5 over these channels may comprise: frequency and timing synchronization information, a system bandwidth, a control channel structure, a system frame number, one or more cell identifiers, data related to the other network nodes. Preferably, each channel is broadcasted using the time/frequency resources of the communication network CN.

Moreover, each network node N1-N5 of the communication network CN is preferably configured to transmit also reference signals that may be used by the user terminal to decode the information carried over the channel(s) broadcasted by the network node. Preferably, also the reference signals are broadcasted using the time/frequency resources of the communication network CN.

In case the communication network CN is an LTE communication network, each network node N1-N5 (namely, each eNodeB) is configured to transmit a synchronization channel comprising a primary synchronization signal (PSS) and a secondary synchronization signal (SSS) allowing the user terminal to achieve the center frequency of the channel bandwidth, the radio frame, subframe, slot and symbol timing synchronization, and the cell identifier (CID). Synchronization signals are transmitted twice per 10 ms radio frame. The PSS is located in the last OFDM symbol of the first and 11-th time slot of each radio frame. The SSS is located in the OFDM symbol immediately before the last OFDM symbol of the first and 11-th time slot of each radio frame.

Moreover, each eNodeB is configured to transmit a physical broadcast channel (PBCH) comprising the Master Information Block (MIB), as already described above. The MIB (14 bits long) is mapped onto 72 sub-carriers of the OFDM grid. The PBCH transmission occurs on the second time slot of the first subframe of four consecutive radio frames and is thus periodically repeated with a period equal to 40 ms.

Furthermore, each eNodeB is configured to transmit reference signals in the form of pseudorandom sequences of reference (or pilot) symbols within the radio frame. The reference signals are in pre-determined locations within the radio frame, and these locations may be recovered using the cell identifier. For instance, the downlink reference signals may be transmitted every first and fifth OFDM symbol of a time slot with a frequency spacing of six sub-carriers, when one antenna is used for transmission. The recovered reference signals are employed at the user terminal to decode the PBCH and achieve the network information of the MIB.

Preferably, the network nodes N1-N5 of the communication network CN are synchronized. In particular, at each network node N1-N5, the radio frame start is aligned in time, within a certain error bound, with the radio frame start of all the other network nodes N1-N5. This can be achieved by implementing protocols such as the IEEE 1588 PTP (Precision Time Protocol), Synchronous Ethernet (SyncE) or by exploiting other systems like the Global Positioning System (GPS).

According to the present invention, the communication network CN comprises also a network controller C which is preferably connected to the network nodes N1-N5 or to a subset thereof (in FIG. 1, for example, the controller C is connected to three network nodes N1-N3). The controller C may be in the form of a hardware device, a hardware device running a dedicated software, a software module, a distributed software. It may be implemented over a standalone apparatus connected to the network nodes either through a wired or a wireless connection, or over a network node or it may be distributed over all the network nodes of the communication network CN or a subset thereof. In case the network controller C is implemented over a network node or in case it is distributed over the network nodes, the network nodes are preferably configured to exchange the information needed by the network controller C either wirelessly or through wired connections. The network controller C is preferably configured to coordinate and control the network nodes N1-N5 or a subset thereof.

According to the present invention, a group of network nodes of the communication network CN is associated with a same group identifier. The network nodes identified by the group identifier are preferably selected on the basis of their geographical location. In particular, a given group identifier may be associated with a group of network nodes that are geographically adjacent and have similar network configurations. The "network configuration" of a network node may comprise parameters such as the transmission bandwidth and the transmission power, and may be related to the environment (e.g. rural, urban) in which the network node is located. Typically, adjacent network nodes operating in a given rural area have the same network configuration. In alternative or in addition, a given group identifier may be associated with a group of network nodes that are managed by a same controller C. In this case, the maximum number of network nodes identified by a same given group identifier may depend on the processing resources of the controller C. The more resources are available at the controller C, the higher the number of network nodes that the controller C may manage. The network nodes identified by a given group identifier will be referred to in the following as "coordinated network nodes". Each coordinated network node is then associated with a joint cell identifier, which may be referred to as "JCID", which comprises the group identifier and a specific cell identifier indicative of the specific network node (e.g. the cell ID in a LTE communication network). For instance, the joint cell identifier may correspond to the specific cell identifier of the network node wherein a number of bits (e.g. the most significant bits) represent the group identifier and are repeated in the joint cell identifiers of all the coordinated network nodes.

FIG. 1, for example, shows three coordinated network nodes N1, N2, N3 that are geographically adjacent within an area A. FIG. 1 also shows the connection between the controller C (represented, for sake of example, as a stand-alone device) and each coordinated network node N1-N3 as a wired connection. This is merely exemplary as the network nodes managed by a same controller C may be connected to it through a wireless connection. The network nodes managed by the controller C do not need to be directly connected to the controller C but they may also be connected to the controller C indirectly, via other network nodes.

Figure 2:
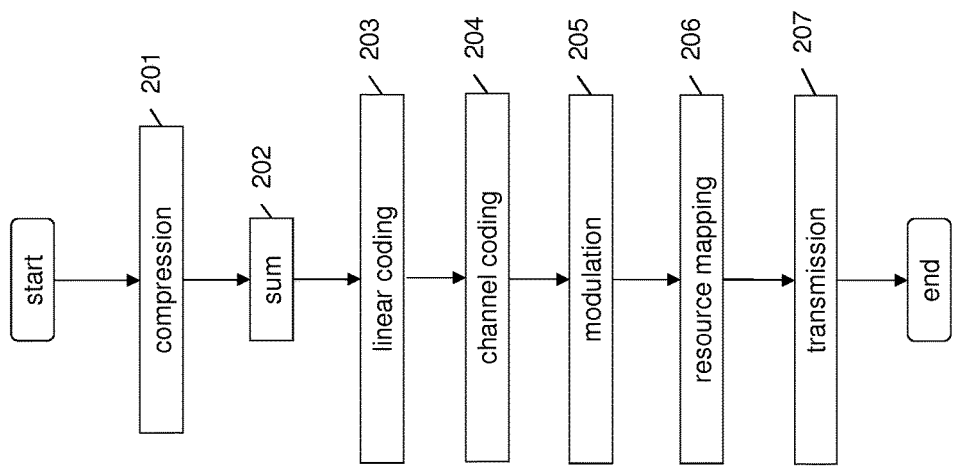
FIG. 2 is a flow chart of the method according to the present invention.

FIG. 2 is a flowchart illustrating the steps of the method according to the present invention. Steps 201-204 of FIG. 2 are preferably performed by the controller C while steps 205-207 are preferably performed by each coordinated network node after having received from the controller C the resulting signals as processed at step 204. Alternatively, also step 205 may be performed by the controller C and the resulting signals may be sent to the coordinated network nodes N1-N3 for resource mapping and transmission, as it will be described in detail herein after.

FIG. 3 illustrates in more detail steps 201-203 of the method of the present invention.

At step 201, broadcast network information of the coordinated network nodes are preferably compressed. At this stage, the broadcast network information of a coordinated network node may comprise information needed by a user terminal to access the communication network through the network node, such as a system bandwidth, a control channel structure, a system frame number (e.g. the MIB information in a LTE communication network). In particular, the broadcast network information of the coordinated network nodes are preferably collected by the controller C, which then eliminates redundancies in the broadcast network information. The compression of step 201 of the method of the present invention is preferably performed using a lossless compression algorithm. Examples of known lossless compression algorithms that may be used are the Run Length Encoding Algorithm, the Huffman Encoding, the Shannon Fano Algorithm, the Arithmetic Encoding and the Lempel Zev Welch Algorithm.

FIG. 3 schematically shows three sets of broadcast network information NI1, NI2, NI3 of the three coordinated network nodes N1-N3, represented in FIG. 3 as arrays of data. Each exemplary array NI1-NI3 comprises three broadcast network information: the broadcast network information of the first array NI1 are X1, X2, X3, the broadcast network information of the second array NI2 are X1, X2, X4 and the broadcast network information of the third array NI3 are X1, X2, X5. For instance, in an LTE communication network, the broadcast network information X1 may be the downlink system bandwidth comprised within the MIB of nodes N1-N3, which is common to all the coordinated nodes N1-N3; the broadcast network information X2 may be the physical H-ARQ information channel structure comprised within the MIB of nodes N1-N3, which is common to all the coordinated nodes N1-N3; the broadcast network information X3 may be the system frame number comprised within the MIB of node N1; the broadcast network information X4 may be the system frame number comprised within the MIB of node N2; the broadcast network information X5 may be the system frame number comprised within the MIB of node N3. According to this exemplary situation, the system frame number is different for the coordinated network nodes N1, N2, N3, while the other broadcast network information comprised within the MIB related to these network nodes are common to the three nodes.

As schematically represented in FIG. 3, the compression performed by the controller C at step 201 eliminates redundancies and permits to avoid the repetition of the broadcast network information which are common to the coordinated network nodes.

Moreover, the controller C, at step 202, may add to the compressed broadcast network information, further broadcast network information related to one or more coordinated network nodes. These data may comprise: one or more identifiers of overloaded network nodes, one or more identifiers of switched-off network nodes, transmit power(s), power boost configuration(s), ABS (Almost Black Subframe) subframe configuration(s), radio interface overload indicator(s), backhaul status load indicator(s).

This data are indicated in FIG. 3 as Y1 and Y2.

The controller C, at the end of steps 201 and 202, preferably provides a set of joint network information JNI comprising the compressed broadcast network information of the coordinated network nodes and the further broadcast network information that are possibly added to the compressed broadcast network information at step 202. In the exemplary scenario illustrated in FIG. 3, the outcome of the operations performed by the controller C at steps 201 and 202 is the set or array of joint network information JNI=[X1 X2 X3 X4 X5 Y1 Y2].

In an LTE scenario, the joint network information JNI comprises a sequence of bits containing the information of the MIBs of the coordinated network nodes, wherein the repetitions of common information are eliminated, and possibly containing other information related to the coordinated network nodes which may allow, for instance, to implement inter-cell interference coordination and cancellation (ICIC) techniques.

At step 203, the controller C preferably codes the joint network information JNI. In particular, preferably, the controller C applies a linear code to the joint network information JNI. A known linear code that may be applied is described in D. S. Lun, M. Médard, R. Koetter, "Network Coding for Efficient Wireless Unicast", Proceedings of the 2006 International Zurich Seminar on Communications, p. 74-77, Feb. 21-24 2006.

During step 203, the joint network information JNI is preferably segmented into a number M of blocks Bi, where i=1, . . . , M is an integer index indicating the specific block. M is an integer number equal to or higher than 1. Each block Bi preferably comprises a same pre-determined number of bits. In FIG. 3, as an example, the joint network information JNI is segmented into three blocks B1, B2 and B3. The number of blocks into which the joint network information is segmented may depend on the number of radio resources available for transmission of this information in a radio subframe. Alternatively or in addition, the number of blocks may depend on the number of coordinated network nodes. In the exemplary situation described above, the number of blocks is equal to the number of coordinated network nodes.

Then, at step 203, the blocks Bi into which the joint network information is segmented are preferably linearly combined. In particular, a number K of linear combinations of the blocks Bi are computed, wherein each linear combination is computed according to the following equation:

$$CBj = \sum_{i=1}^{M} C_{ij} \cdot Bi \quad [1]$$

wherein j is an integer index indicating the specific linear combination of M blocks Bi, the notation "CBj" indicates the j-th linear combination of the blocks Bi and $C_{ij}$ are the coefficients of the j-th linear combination CBj. The number of linear combinations K is an integer number equal to or higher than M. In FIG. 3, as an example, a linear combination CBj of the three blocks B1, B3, B3 is shown.

Preferably, each linear combination CBj is computed by considering a different set of coefficients $C_{ij}$, namely $C_{ij+1} \neq C_{ij}$ for j=1, . . . , K. Preferably, the coefficients Cg are pseudo-randomly generated on the basis of the cell identifier (CID) or a geographical area identifier (e.g. the joint cell identifier). The same function used at transmission side to generate the coefficients $C_{ij}$ should to be used at the reception side so as to generate the same coefficients. Alternatively, the coefficients $C_{ij}$ can be transmitted together with the broadcast information in order to be used at the reception side for the detection.

At step 204, each linear combination CBj can be optionally coded with an inner channel coder, like a Viterbi or a Turbo coder, in order to increase the protection.

At step 205, a coded linear combination CBj is modulated for transmission by the coordinated network nodes N1-N3. In particular, a QPSK modulation is preferably used, due to its high robustness to noise, but also 16-QAM or 64-QAM modulations may be used. At step 206, the modulated linear combination CBj (for simplicity, the same reference notation "CBj" will be used herein after for indicating the linear combination of the blocks Bi before and after modulation) is mapped on a time/frequency resource of the communication network CN which is reserved for transmission of a joint physical broadcasting channel (also referred to as "JPBCH") by all the coordinated network nodes N1-N3. At step 207, the modulated linear combination CBj is preferably transmitted on the joint physical broadcasting channel.

Steps 205, 206 and 207 of the method of the present invention are preferably repeated in order to perform the transmission, on the joint physical broadcasting channel, of all the K linear combinations CBj with j=1, . . . , K. The method of the present invention provides for cyclically repeating the transmission of the K modulated linear combinations CBj by each coordinated network node N1-N3, with a period P of, for example, 10 subframes (i.e. 10 ms in the LTE case) between two consecutive transmissions of the linear combinations CBj. Taking into account that K different CBj linear combinations are generated and then modulated and transmitted, in each time/frequency resource preferably only one CBj of the K combinations is transmitted.

As mentioned above, in the LTE case, the Physical Broadcast Channel (PBCH) containing the MIB information is transmitted every 10 ms (i.e. every frame) in 6 physical resource blocks (PRBs) at the center of the bandwidth and the information is repeated over four consecutive frames. According to the present invention, each linear combination CBj can be mapped in frequency resources at the center of the transmission bandwidth to facilitate the demodulation of the broadcast channel. Indeed, typically, users do not know the system bandwidth before the detection of the broadcast channel. As far as time periodicity is considered (i.e. the period of transmission of the linear combinations CBj), a high transmission frequency may reduce the acquisition delay of the network information at the user side, as it will be clearer in the following description. Due to the fact that the broadcast network information are compressed (as described with reference to step 201 according to the present invention), a high transmission frequency does not necessarily correspond to a large use of transmission resources and thus to a large overhead as compared to the transmission of the MIB information in current LTE networks.

In the following description, the transmission of the modulated linear combinations CBj by the coordinated network nodes N1-N3 will be described in more detail according to a first embodiment and to a second embodiment of the present invention.

As described above, in a LTE communication network, synchronization signals are exploited by the user terminal to acquire the synchronization with the cell and recover the cell identifier, which is not transmitted in the MIB. According to the present invention, at least one synchronization signal is preferably mapped into a number of time/frequency resources of the communication network CN and transmitted within the radio frame by each coordinated network node N1-N3, the synchronization signal allowing recovery of the joint cell identifier at the user terminal. The procedure for recovering the joint cell identifier may be, for instance, analogous to the procedure according to which, in the LTE system, the PSS and SSS are used to recover the cell identifier.

As mentioned above, the joint cell identifier comprises both the group identifier identifying the group of coordinated network nodes N1-N3 and the specific cell identifier identifying the network node inside the group transmitting the signal.

The method of the present invention further provides for mapping into a number of time/frequency resources of the communication network CN a number of joint reference signals that may be used by the user terminal to decode the joint physical broadcasting channel and recover the joint network information. The joint reference signals are preferably pseudorandom sequences of pilot symbols generated at the coordinated network nodes N1-N3. The joint reference signals are preferably transmitted within the radio frame by all the coordinated network nodes N1-N3.

Preferably, according to a first embodiment of the present invention, all the coordinated network nodes N1-N3 generate the same joint reference signal(s) on the basis of the group identifier comprised within the joint cell identifier. According to this embodiment of the present invention, the location of the joint reference signal(s) within the time/frequency grid of the communication network CN is recovered at the user terminal by using the joint cell identifier, and in particular, the group identifier of the coordinated network nodes N1-N3 comprised in the joint cell identifier.

The procedure that the user terminal may employ to recover the location of the joint reference signal(s) may be, for instance, analogous to the procedure according to which, in the LTE system, the location of the cell specific reference signals is recovered by using the specific cell identifier. Moreover, the procedure to decode the joint physical broadcasting channel by using the joint reference signal(s) may be analogous to the procedure according to which, in the LTE system, the cell specific reference signals are used to decode the physical broadcasting channel. In particular, by means of the joint cell identifier, the user terminal can determine the position(s) and the specific pseudorandom sequence(s) used for the transmission of the joint reference signal(s). The joint reference signal(s) are then used as phase reference for the coherent detection of the joint physical broadcasting channel.

According to the first embodiment of the method of the present invention, transmission of the joint physical broadcasting channel is preferably synchronized among the coordinated network nodes N1-N3.

In particular, all the coordinated network nodes N1-N3 cyclically transmit the same sequence of linear combinations CBj over the joint physical broadcasting channel by using the same time/frequency resources for such transmission (namely, the joint physical broadcasting channel is transmitted by each coordinated network node at the same time and using the same sub-carriers). Moreover, the joint network information are recovered by the user terminal served by one of the coordinated network nodes N1-N3 by using the joint reference signal(s) transmitted by the coordinated network nodes N1-N3. In this case, the same joint reference signals are transmitted by all the coordinated network nodes N1-N3. Preferably, the group identifier which is common to all the coordinated network nodes N1-N3 has to be used to generate the sequence of joint reference signals. According to this embodiment, the coordinated network nodes N1-N3 preferably implement a so-called single frequency network (SFN) for the transmission of the joint physical broadcasting channel as shown in FIG. 4a.

FIG. 4a schematically illustrates the transmission of the modulated linear combinations CBj by each coordinated network node N1, N2, N3 on a time axis t. As apparent, each coordinated network node N1, N2, N3 transmits the same modulated linear combination CBj at the same time.

At the user terminal, the joint network information may be recovered by decoding a number of different linear combinations CBj at least equal to the number M of blocks Bi into which the joint network information is segmented at the controller C. If the number of blocks Bi is three, the minimum number of different linear combinations CBj that must be correctly decoded at the user terminal in order to recover the joint network information is three. This condition derives from the fact that the linear combination of the information blocks Bi can be mathematically expressed as a linear system with M equations and M unknowns, as shown by the equation [1]. It then follows that this system can be solved only if there are at least M equations, where each equation corresponds to one linear combination.

Advantageously, since using a SFN technique means that all the coordinated network nodes transmit the same data over the joint physical broadcasting channel, the transmission coverage for the broadcast network information which is achieved within the communication network according to the present invention is increased with respect to a state-of-the-art communication network (such as a standard LTE communication network) in which each network node transmits a different physical broadcasting channel carrying the respective broadcast network information. Indeed, according to the present invention, the signals transmitted by the coordinated network nodes are the same and they are summed at the receiving user terminal and hence the channel quality improves.

On the other side, the method according to the present invention allows a network node to broadcast an increased amount of network information (namely, the network information related to all the other nodes of the group of coordinated network nodes) to the user terminal served by the network node without reducing the reception reliability of the network information.

According to a second embodiment of the present invention, each coordinated network node N1-N3 generates cell specific reference signal(s) on the basis of the specific cell identifier of the network node. Hence, according to this second embodiment, the different reference signals are generated and transmitted by the coordinated network nodes N1-N3. According to this embodiment of the present invention, the location of the reference signal(s) within the time/frequency grid of the communication network CN is recovered at the user terminal by using the joint cell identifier, and in particular, the specific cell identifier of the coordinated network nodes N1-N3 comprised in the joint cell identifier.

The procedure that the user terminal may employ to recover the location of the reference signal(s) may be, for instance, analogous to the procedure according to which, in the LTE system, the location of the cell specific reference signals is recovered by using the specific cell identifier. Again, the procedure to decode the joint physical broadcasting channel by using the cell specific reference signal(s) may be analogous to the procedure according to which, in the LTE system, the cell specific reference signals are used to decode the physical broadcasting channel. In particular, by means of the joint cell identifier, the user terminal can determine the position and the specific pseudorandom sequence used for the transmission of the cell specific reference signal(s). The cell specific reference signal(s) are then used as phase reference for the coherent detection of the joint physical broadcasting channel.

According to this second embodiment of the method of the present invention, which is schematically illustrated in FIG. 4b, at step 207 each coordinated network node N1, N2, N3, in correspondence of a time/frequency resource, preferably transmits a modulated linear combination CBj which is different from the modulated linear combination CBj that is transmitted by another coordinated network node in correspondence of the same time/frequency resource. Hence, according to this second embodiment, the coordinated network nodes N1-N3 transmit different modulated linear combinations CBj in correspondence of the same time/frequency resource. For instance, as represented in FIG. 4b, at time t1, the coordinated network node N1 transmits the modulated linear combination CB1, the coordinated network node N2 transmits the modulated linear combination CB2 while the coordinated network node N3 transmits the modulated linear combination CB8; at time t2, the coordinated network node N1 transmits the modulated linear combination CB4, the coordinated network node N2 transmits the modulated linear combination CB6 while the coordinated network node N3 transmits the modulated linear combination CB7; and so on. In this case, the coordinated network nodes N1-N3 do not need to be synchronized. However, synchronization is preferably implemented also in this case as it facilitates the network nodes coordination.

FIGS. 5a and 5b schematically illustrates another example of transmission of the joint network information by the coordinated network nodes N1-N3. According to this example, the joint network information is segmented into three blocks (M=3) and linearly coded in five different linear combinations CBj where j=1, . . . , 5. In FIGS. 5a and 5b, the transmission with SFN technique (first embodiment, FIG. 5a) is compared to the transmission without SFN technique (second embodiment, FIG. 5b). In FIGS. 5a and 5b, the repetition period P is also indicated, which represents the time period between two consecutive transmissions of the linear combinations CBj at a coordinated network node N1-N3. For decoding the joint network information, at a coordinated network node N1-N3, at least three linearly independent linear combinations CBj have to be correctly received. According to the embodiment illustrated in FIG. 5a, the coverage area is higher than according to the embodiment illustrated in FIG. 5b because the SFN technique is exploited. However, the minimum decoding time of the joint network information is equal to three times the repetition period P. Conversely, according to the embodiment illustrated in FIG. 5b, the minimum decoding time of the joint network information is equal to one repetition period P. The solution illustrated in FIG. 5b can be easily obtained by time shifting the transmission of a same linear combination CBj among the different coordinated network nodes N1-N3.

Advantageously, according to this second embodiment, the method of the present invention allows reducing the decoding latency. Indeed, since the coordinated network nodes, at a same time, transmit different linear combinations of the blocks into which the joint network information is segmented, the joint network information can be recovered at the user terminal by decoding the different linear combinations received from different coordinated network nodes at the same time. As represented in FIG. 4b, at time t1, for instance, the linear combinations CB1, CB2 and CB8 are simultaneously transmitted by the coordinated network nodes N1, N2, N3 respectively. In FIG. 5b, the linear combinations CB1, CB2 and CB3 are simultaneously transmitted by the coordinated network nodes N1, N2, N3, respectively, at a first time, then the linear combinations CB2, CB3 and CB4 are simultaneously transmitted, and so on. The user terminal receiving these linear combinations and decoding them may advantageously recover the joint network information faster than according to the first embodiment of FIGS. 4a and 5a. Indeed, according to the embodiment of FIGS. 4a and 5a, each coordinated network node transmits different linear combinations in consecutive time intervals and hence a user terminal may recover the joint network information only after reception of at least three different linear combinations from a network node. However, as explained above, the method as schematically represented in FIGS. 4a and 5a provides a better channel quality than the method of FIGS. 4b and 5b, as the signals from the coordinated network nodes are all equal and they are actually summed at the user terminal.

The invention claimed is:

1. A method for transmitting broadcast network information in a mobile wireless communication network comprising a plurality of network nodes, said method comprising:
    a) providing a compression of broadcast network information related to a group of coordinated network nodes of said plurality of network nodes;
    b) coding said compressed broadcast network information by segmenting said compressed broadcast network information into a number of blocks and linearly combining said blocks into a plurality of linear combinations of blocks; and
    c) transmitting said linear combinations of blocks by said group of coordinated network nodes.

2. The method according to claim 1, wherein the method further comprises associating said group of coordinated network nodes with a group identifier and each coordinated network node with a joint cell identifier comprising said group identifier and a specific cell identifier.

3. The method according to claim 1, wherein said providing a compression of broadcast network information comprises eliminating redundancies in the broadcast network information of said group of coordinated network nodes.

4. The method according to claim 3, wherein said providing a compression of broadcast network information comprises implementing a lossless compression algorithm.

5. The method according to claim 1, further comprising, after said coding, applying an inner channel coder selected between a Viterbi coder and a Turbo coder.

6. The method according to claim 1, further comprising modulating for transmission said linear combinations, said modulating comprising applying a QPSK modulation.

7. The method according to claim 2, further comprising transmitting, by each coordinated network node, at least one synchronization signal allowing recovery of, at a user terminal, the associated joint cell identifier.

8. The method according to claim 1, wherein said transmitting said linear combinations of blocks comprises cyclically transmitting a same sequence of said linear combinations by each coordinated network node in a synchronized manner over a joint physical broadcasting channel.

9. The method according to claim 7,
    wherein said transmitting said linear combinations of blocks comprises cyclically transmitting a same sequence of said linear combinations by each coordinated network node in a synchronized manner over a joint physical broadcasting channel, and
    wherein said method further comprises:
        generating, at the coordinated network nodes based on said group identifier, one or more joint reference signals, said joint reference signals being the same for all the coordinated network nodes, and
        using, at said user terminal, said joint cell identifier to recover said joint reference signals and decode said joint physical broadcasting channel.

10. The method according to claim 1, wherein said transmitting said linear combinations of blocks comprises cyclically transmitting a different sequence of said linear combinations by each coordinated network node over a joint physical broadcasting channel.

11. The method according to claim 7,
    wherein said transmitting said linear combinations of blocks comprises cyclically transmitting a different sequence of said linear combinations by each coordinated network node over a joint physical broadcasting channel, and wherein said method further comprises:
generating, at each coordinated network node based on said specific cell identifier, one or more reference signals, said reference signals being different among the coordinated network nodes, and
using, at a user terminal, said joint cell identifier to recover said reference signals and decode said joint physical broadcasting channel.

12. A hardware controller for a mobile wireless communication network comprising a plurality of network nodes, said hardware controller comprising:
a processor; and
a non-transitory computer-readable storage medium storing instructions that, when executed by the processor, cause the hardware controller to:
provide a compression of broadcast network information related to a group of coordinated network nodes of said plurality of network nodes; and
code said compressed broadcast network information by segmenting said compressed broadcast network information into a number of blocks and linearly combining said blocks into a plurality of linear combinations of blocks.

13. A mobile wireless communication network comprising:
a plurality of network nodes; and
a hardware controller, said hardware controller being configured to:
provide a compression of broadcast network information related to a group of coordinated network nodes of said plurality of network nodes; and
code said compressed broadcast network information by segmenting said compressed broadcast network information into a number of blocks and linearly combining said blocks into a plurality of linear combinations of blocks, said group of coordinated network nodes being configured to transmit said linear combinations of blocks.

14. The mobile wireless communication network according to claim 13, wherein said group of coordinated network nodes implement a single frequency network, SFN.

15. The mobile wireless communication network according to claim 14, wherein said mobile wireless communication network is a long term evolution, LTE, communication network.

* * * * *